United States Patent [19]
Jun

[11] Patent Number: 5,864,154
[45] Date of Patent: Jan. 26, 1999

[54] SEMICONDUCTOR MEMORY DEVICE AND METHOD FOR FABRICATING THE SAME

[75] Inventor: Young Kwon Jun, Seoul, Rep. of Korea

[73] Assignee: LG Semicon Co., Ltd., Seoul, Rep. of Korea

[21] Appl. No.: 804,664

[22] Filed: Feb. 25, 1997

Related U.S. Application Data

[60] Continuation of Ser. No. 477,784, Jun. 6, 1995, abandoned, which is a division of Ser. No. 193,703, Feb. 8, 1994, Pat. No. 5,459,094.

[30] Foreign Application Priority Data

Jan. 12, 1994 [KR] Rep. of Korea ...................... 428/1994

[51] Int. Cl.⁶ .................................................. H01L 27/108
[52] U.S. Cl. ........................... 257/298; 257/307; 257/309
[58] Field of Search .................................. 257/298, 306, 257/307, 308, 309

[56] References Cited

U.S. PATENT DOCUMENTS

| | | | |
|---|---|---|---|
| 5,049,957 | 9/1991 | Inoue et al. | 257/296 |
| 5,084,405 | 1/1992 | Fazan et al. | 437/52 |
| 5,219,780 | 6/1993 | Jun | 437/52 |
| 5,274,258 | 12/1993 | Ahn | 257/308 |
| 5,323,038 | 6/1994 | González et al. | 257/309 |
| 5,338,955 | 8/1994 | Tamura et al. | 257/308 |

FOREIGN PATENT DOCUMENTS

| | | | |
|---|---|---|---|
| 0398569 | 11/1990 | European Pat. Off. . | |
| 0038061 | 2/1991 | Japan | 257/309 |
| 0216666 | 8/1992 | Japan | 257/309 |
| 0361565 | 12/1992 | Japan | 257/309 |
| 0021751 | 1/1993 | Japan | 257/309 |
| 0283643 | 10/1993 | Japan | 257/309 |

*Primary Examiner*—David B. Hardy
*Attorney, Agent, or Firm*—Morgan, Lewis & Bockius LLP

[57] ABSTRACT

A semiconductor memory device including a plurality of memory cells arranged in a matrix manner, each of the memory cells including a transfer transistor constituted by a gate electrode, a gate insulating film, a source region and a drain region, and a charge storage capacitor constituted by a storage node, a dielectric film and a plate electrode, the storage node of the charge storage capacitor including a cylindrical lower electrode formed above the transfer transistor via an insulating layer formed on the transfer transistor and connected to one of the source region and the drain region of the transfer transistor, and a cover type upper electrode formed on the lower electrode and connected with the lower electrode. By the composite structure of the capacitor storage node including the lower structure having the cylinder shape and the cover type upper structure connected with the lower structure, it is possible to utilize efficiently a three-dimensional space structure and thereby achieve an increase in capacitance.

13 Claims, 19 Drawing Sheets

F I G. 1d *PRIOR ART*
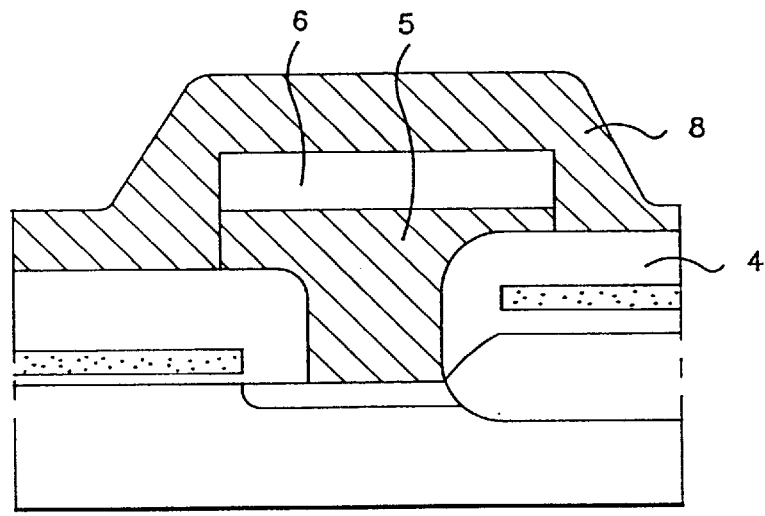
F I G. 1e *PRIOR ART*
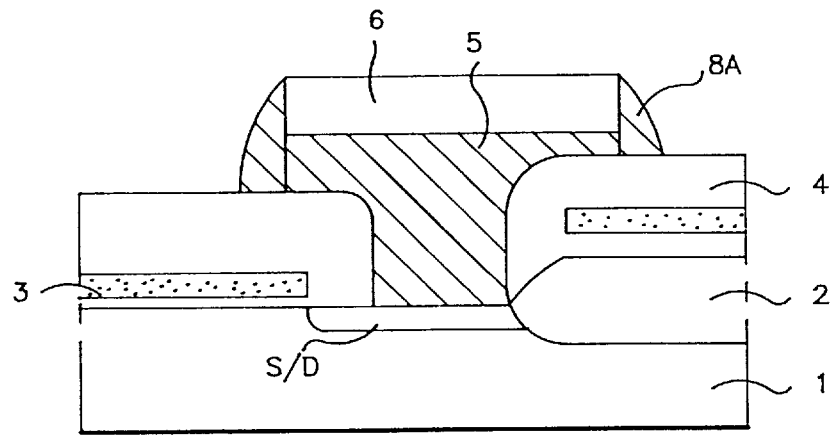
F I G. 1f *PRIOR ART*
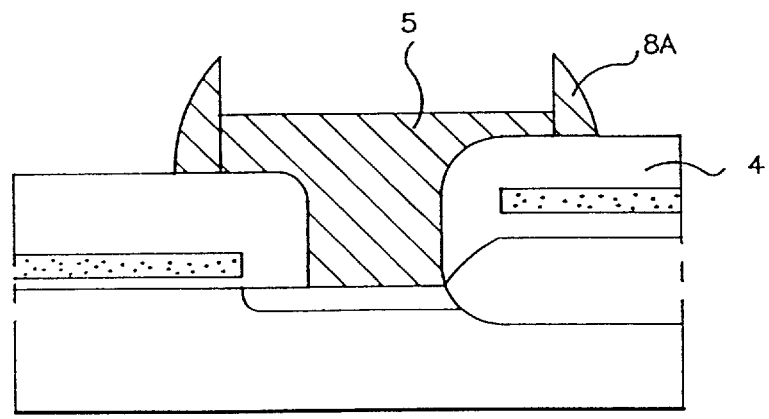

F I G. 1g *PRIOR ART*
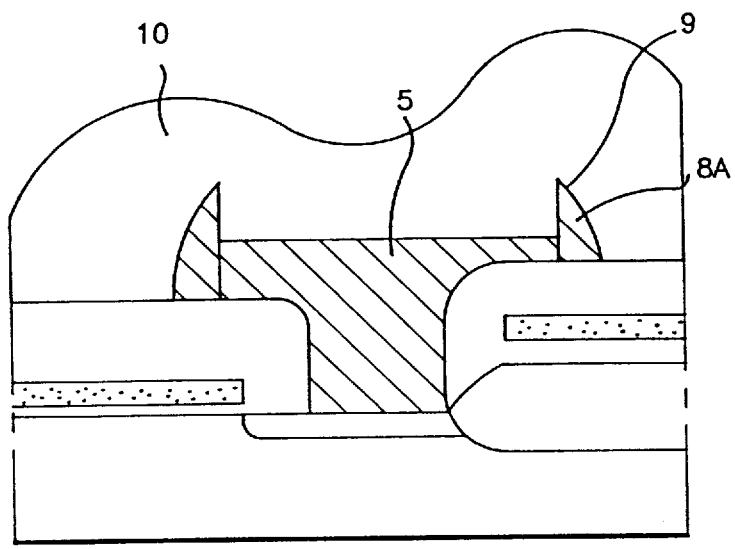
F I G. 2
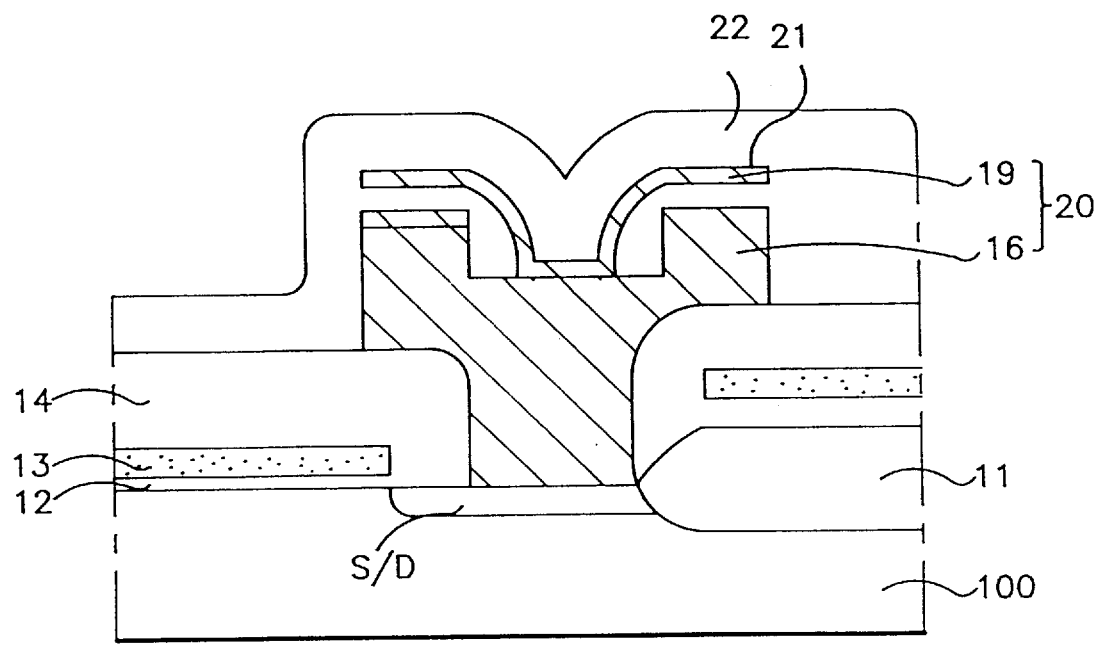

F I G.3
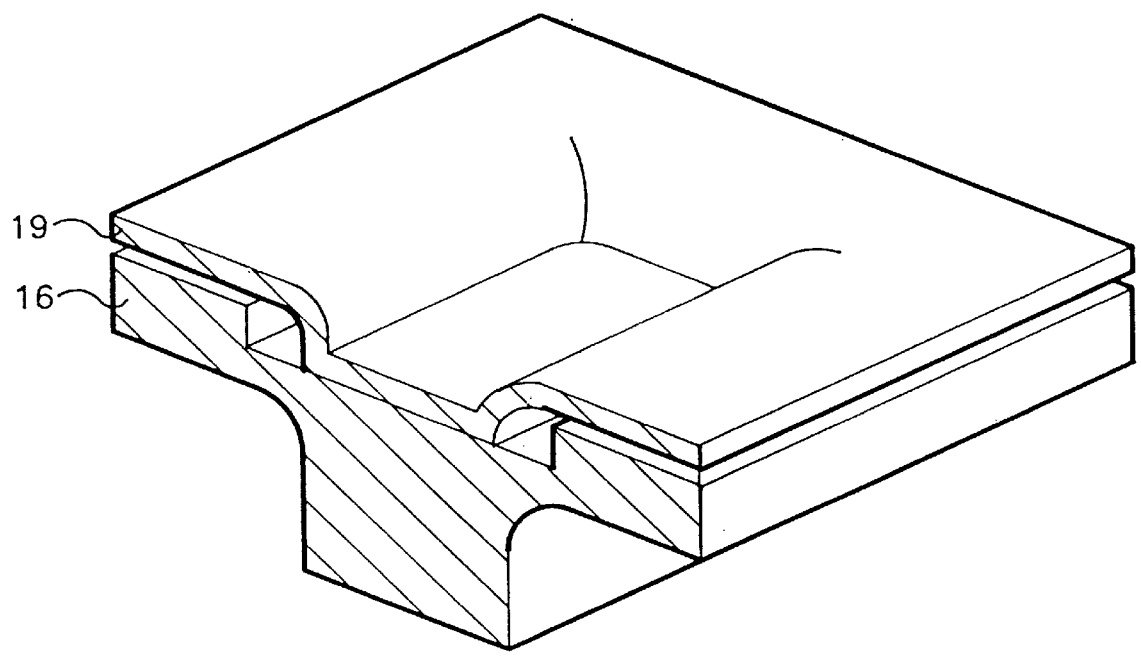

F I G. 6a
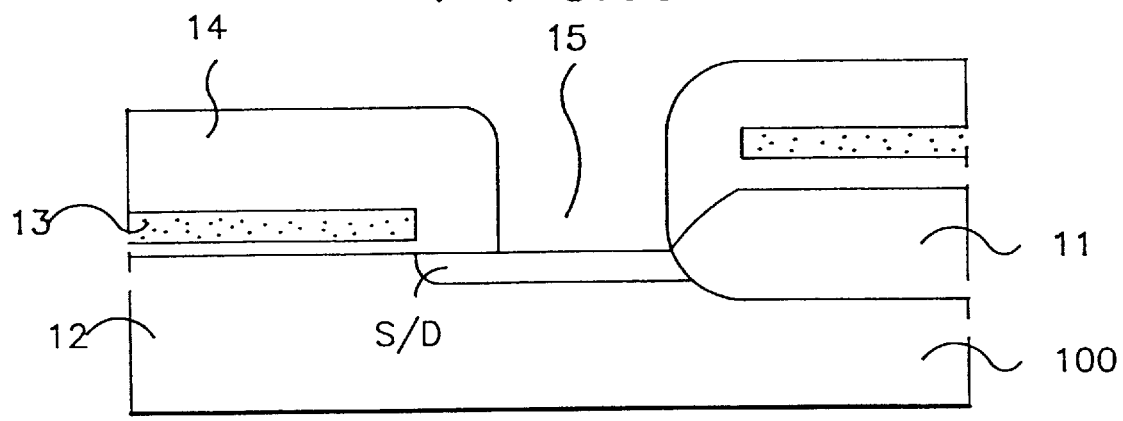
F I G. 6b
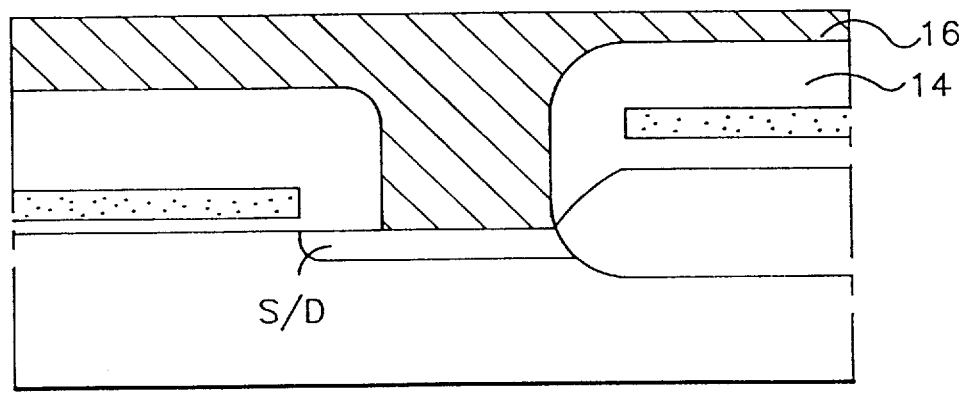
F I G. 6c
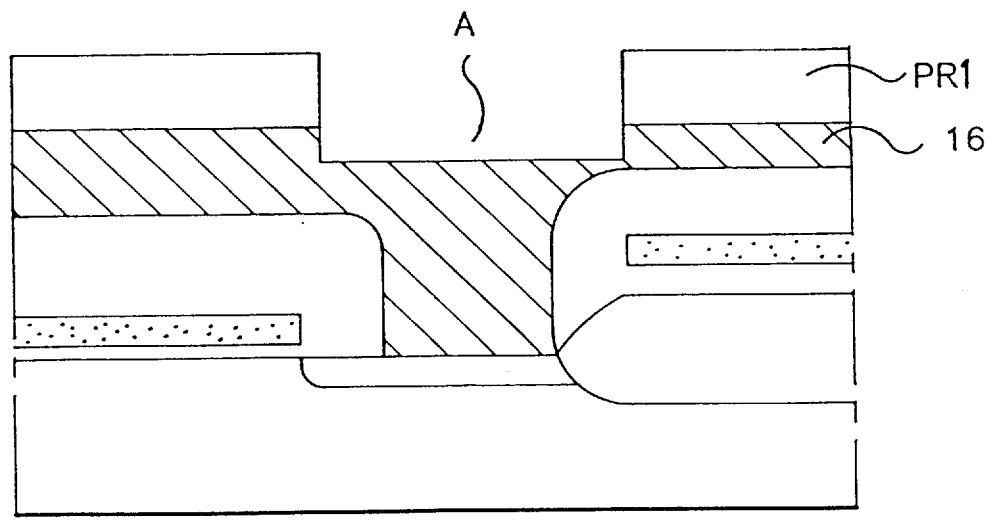

F I G.7f
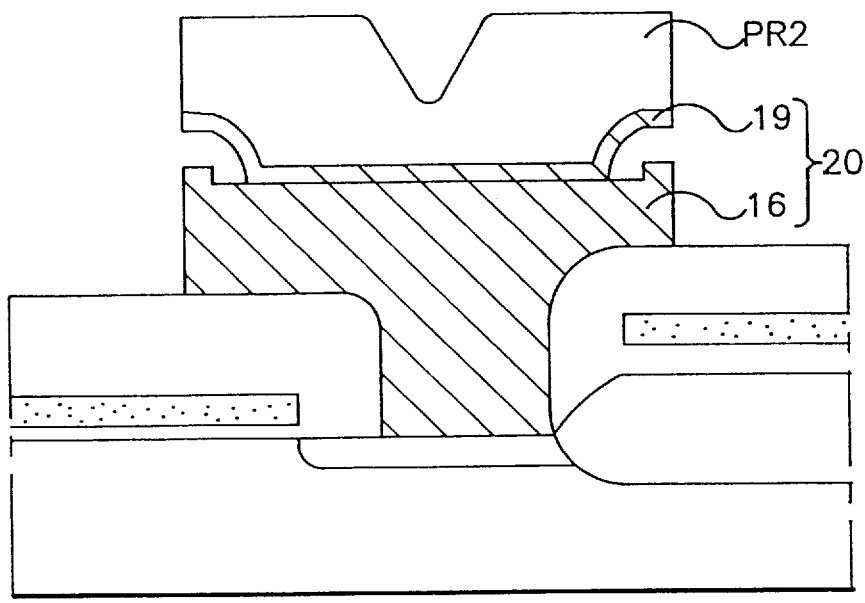
F I G.7g
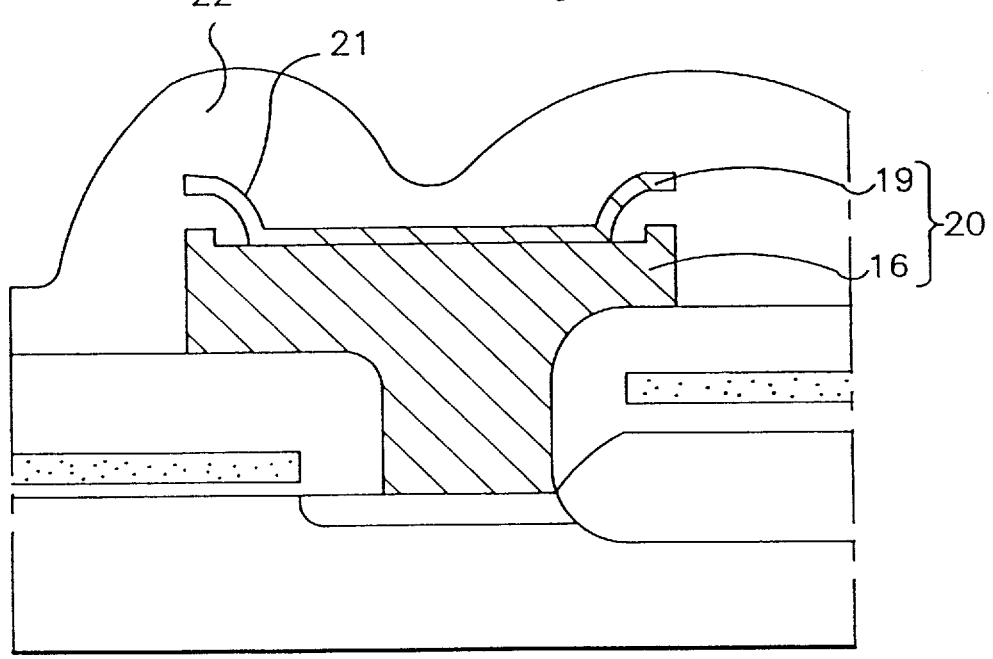

F I G.8d
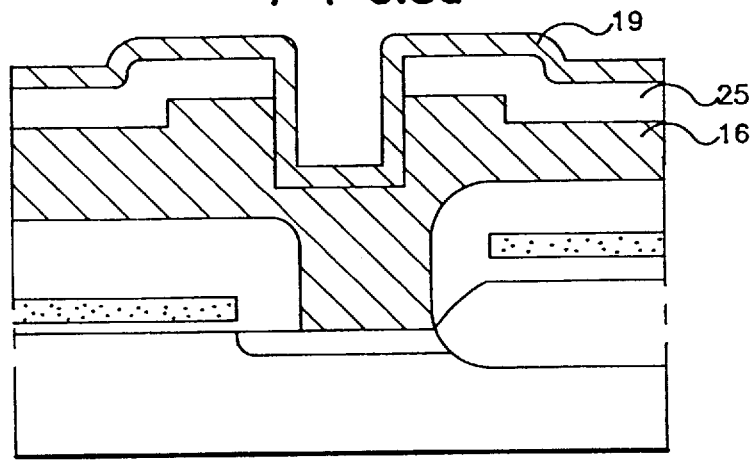
F I G.8e
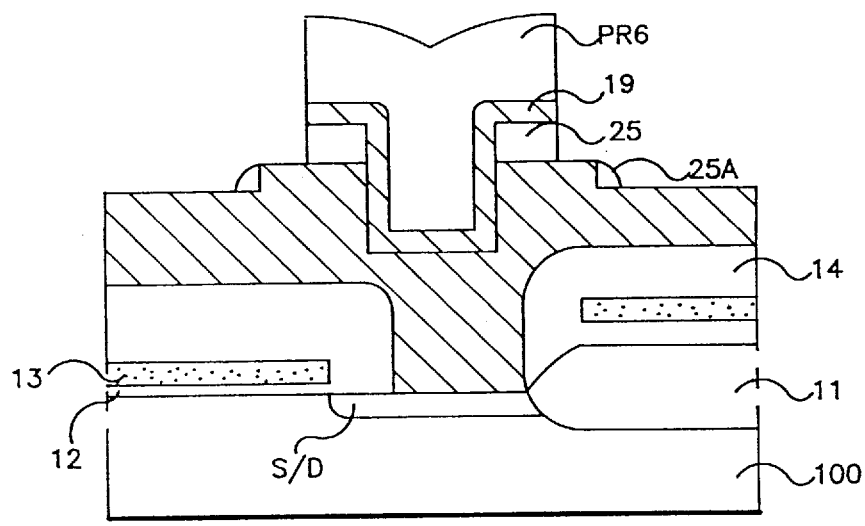
F I G.8f
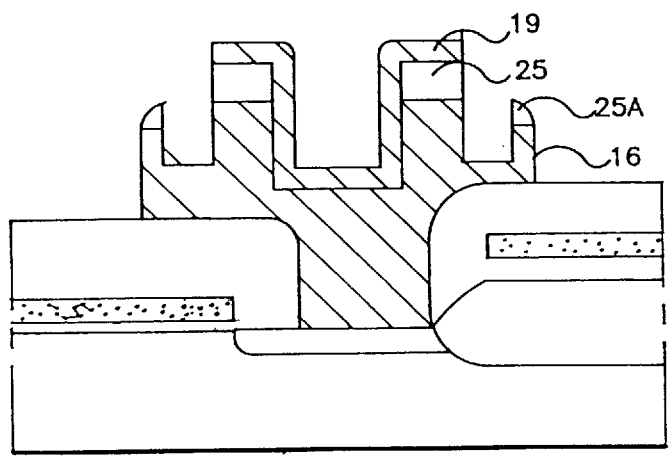

F I G.9c
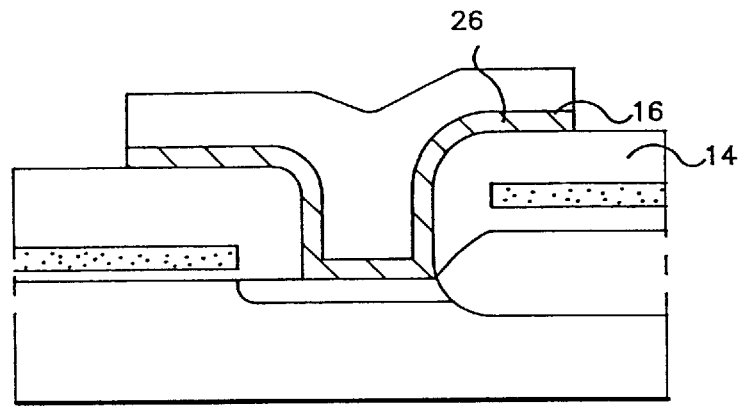
F I G.9d
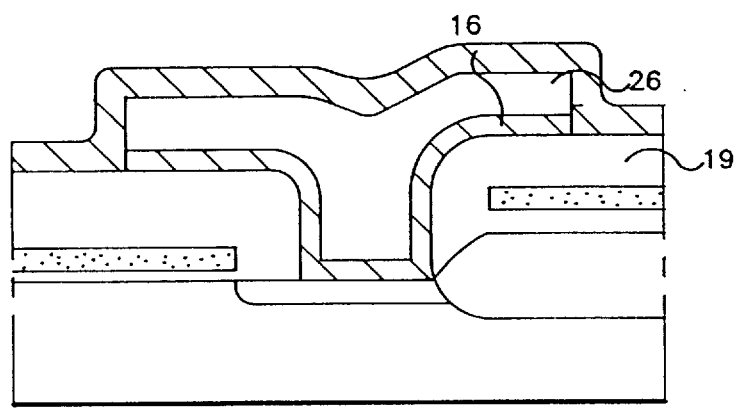
F I G.9e
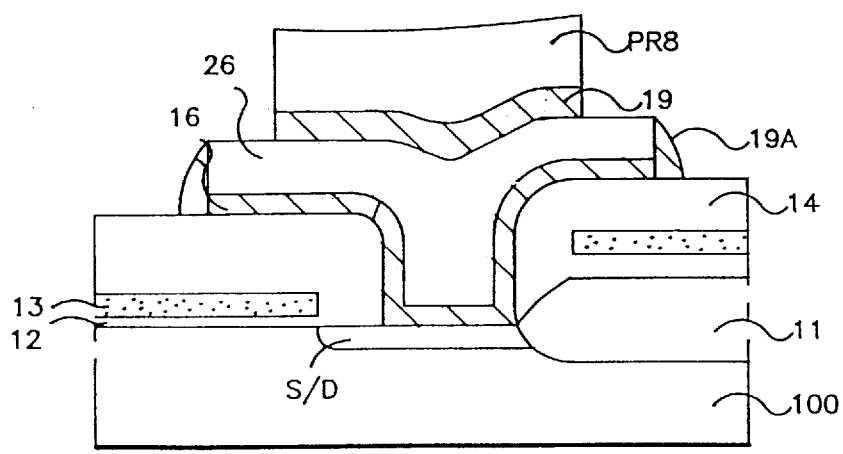

F I G.9f
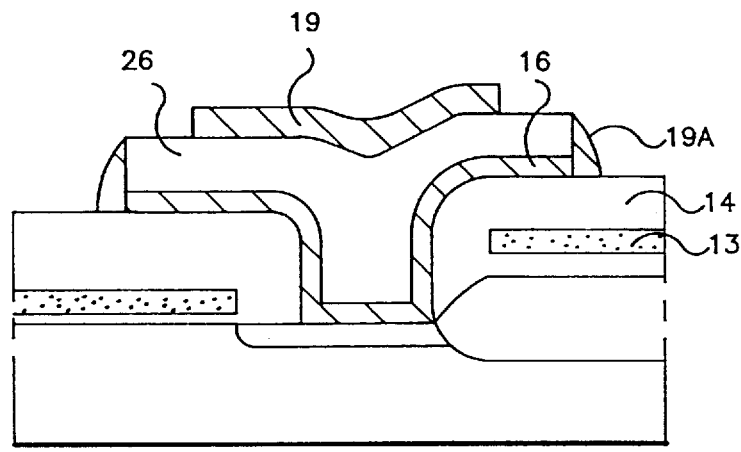
F I G.9g
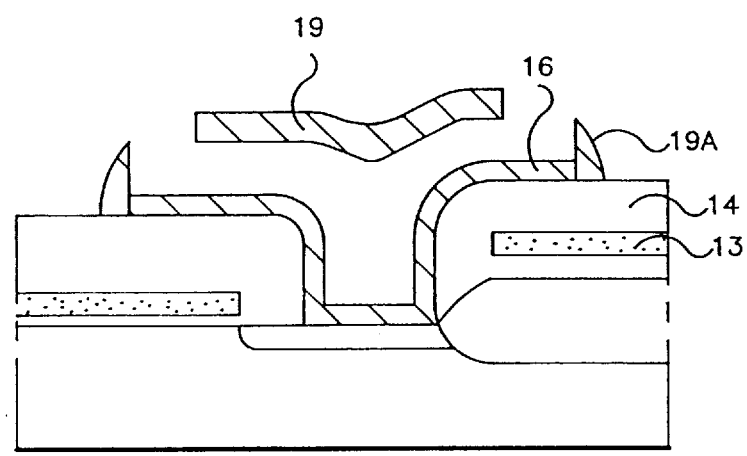

F I G.10
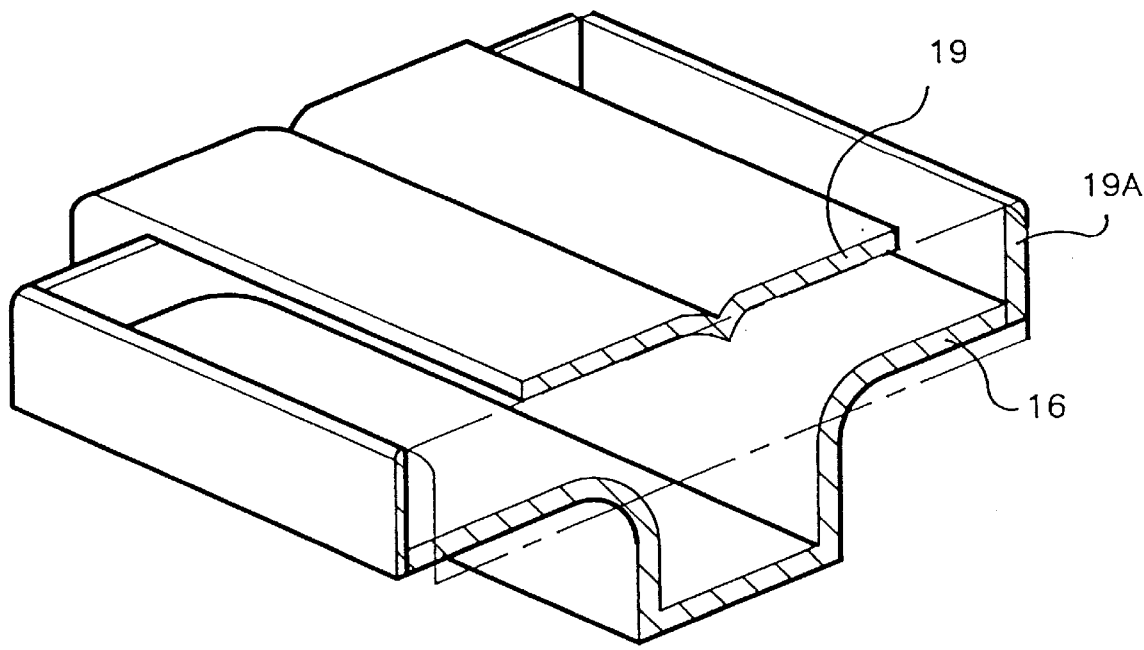

SEMICONDUCTOR MEMORY DEVICE AND METHOD FOR FABRICATING THE SAME

This application is a continuation of application Ser. No. 08/477,784, filed Jun. 6, 1995, now abandoned; which is a divisional of application Ser. No. 08,193,703, filed Feb. 8, 1994 now issued as U.S. Pat. No. 5,459,094.

BACKGROUND OF THE INVENTION

The present invention relates to a semiconductor memory device and a method for fabricating the same, and more particularly to a semiconductor memory device equipped with a capacitor having a large capacitance and a method for fabricating the same.

With the development of semiconductor devices, researches have been actively made for integrating a large number of elements on a single semiconductor chip in a high integration degree. In particular, various cell structures have been proposed for obtaining a minimum dimension in memory cells of dynamic random access memories (DRAMs).

In terms of the minimized dimension for the high integration, each memory cell is desired to be constituted by one transistor and one capacitor. In such a memory cell constituted by one transistor and one capacitor, a signal charge is stored in a storage node of the capacitor connected to a transistor (switching transistor). As the dimension of the memory cell is reduced with an increase in integration degree of the semiconductor memory device, the dimension of the capacitor is reduced, thereby causing the number of signal charges stored in the storage node to be reduced. For transmitting a desired signal without any malfunction, accordingly, the capacitor storage node of the memory cell should have a surface area larger than a predetermined value for obtaining a capacitance of the capacitor required for the signal transmission.

For achieving a reduction in memory cell dimension, the storage node of the capacitor should have a relatively large surface area in a limited region defined on a semiconductor substrate.

There have been proposed various methods for increasing the surface area of the capacitor storage node.

One of methods for increasing the surface area of the capacitor storage node and thus maximizing the capacitance of the capacitor is to fabricate a capacitor having a three-dimensional structure. Up to the present, there have been proposed a variety of three-dimensional structures such as a fin structure, a cylinder structure and a box structure.

Among the three-dimensional structures, the cylinder structure is the structure capable of obtaining a maximum capacitance per unit area. Accordingly, the cylinder structure can be applicable to memory devices of DRAMs of a 16 mega-bit grade or greater.

Now, a method for fabricating a conventional cylinder type capacitor will be described, in conjunction with FIGS. 1a to 1g.

In accordance with the method, a field oxide film 2 is formed on a semiconductor substrate 1 so as to define an active region and an element isolation region in the semiconductor substrate 1, as shown in FIG. 1a. Thereafter, a cell transistor constituted by a gate electrode 3 and source and drain region S/D is formed on a semiconductor substrate 1 by use of a general MOS transistor fabrication process. An insulating layer 4 is formed over the entire exposed surface of the resulting structure and then selectively etched to form a contact hole through which the source region or the drain region of the cell transistor is exposed.

As shown in FIG. 1b, a first polysilicon layer 5 is formed to a thickness of 1,500 to 2,000 Å over the entire exposed surface of the resulting structure. Over the first polysilicon layer 5, an oxide film 6 is formed to a thickness of 5,000 to 6,000 Å. Then, a photoresist pattern 7 is formed on the oxide film 6 by use of a photolithography process using a mask for forming a capacitor storage node.

Using the photoresist pattern 7 as a mask, the oxide film 6 and the first polysilicon layer 5 are etched to form a storage node pattern, as shown in FIG. 1c.

Subsequently, the photoresist pattern 7 is removed, as shown in FIG. 1d. After the removal of the photoresist pattern 7, a second polysilicon layer 8 is formed over the entire exposed surface of the resulting structure. As shown in FIG. 1e, the second polysilicon layer 8 is etched back to form side walls 8A comprised of the second polysilicon layer 8 on the side surfaces of the oxide film 6 and the first polysilicon layer 5.

Thereafter, the oxide film 6 is removed, as shown in FIG. 1f. As a result, a capacitor storage node having a cylinder structure is formed which is constituted by the first polysilicon layer 5 and the second polysilicon side walls 8A.

A capacitor dielectric film 9 is then formed over the entire exposed surface of the resulting structure, as shown in FIG. 1g. Finally, a conduction material is deposited over the capacitor dielectric film 9, thereby forming a capacitor plate electrode 10. Thus, a cylinder type capacitor is fabricated.

In terms of the occupied area of the capacitor storage node, however, this conventional cylinder type capacitor has a drawback of a degraded efficiency of a three-dimensional space utilization because it has a cylindrical structure (the side wall portions denoted by the reference numeral 9 in FIG. 1g) at the outer portion of the storage node pattern while a space is defined in the interior of the cylindrical structure.

SUMMARY OF THE INVENTION

Therefore, an object of the invention is to eliminate the above-mentioned problem, namely, the degraded efficiency of the three-dimensional space utilization encountered in the prior art and to provide a semiconductor memory device equipped with a capacitor having a large capacitance.

Another object of the invention is to provide a method for fabricating a semiconductor memory device capable of maximizing a capacitance of a capacitor equipped in the semiconductor memory device.

In accordance with one aspect, the present invention provides a semiconductor memory device comprising a plurality of memory cells arranged in a matrix manner, each of the memory cells including a transfer transistor constituted by a gate electrode, a gate insulating film, a source region and a drain region, and a charge storage capacitor constituted by a storage node, a dielectric film and a plate electrode, said semiconductor memory device being characterized in that: said storage node of said charge storage capacitor comprises a cylindrical lower electrode formed above said transfer transistor via an insulating layer formed on the transfer transistor and connected to one of said source region and said drain region of the transfer transistor, and a cover type upper electrode formed on said lower electrode and connected with the lower electrode.

In accordance with another aspect, the present invention provides a method for fabricating a semiconductor memory device, comprising the steps of: forming a transfer transistor on a semiconductor substrate, said transfer transistor being constituted by a gate insulating film, a gate electrode, a source region and a drain region; forming a first insulating layer over the entire exposed surface of the resulting structure including the transfer transistor; selectively etching said first insulating layer such that one of said source region and said drain region of the transfer transistor is exposed; forming a first conduction layer over the entire exposed surface of the resulting structure; selectively etching said first conduction layer such that steps are formed on the first conduction layer; selectively forming an insulating layer on the first conduction layer such that the first conduction layer is partially exposed; forming a second conduction layer over the entire exposed surface of the resulting structure such that said second conduction layer is partially connected with the first conduction layer; patterning the second conduction layer by a predetermined storage node pattern; removing said insulating layer formed on the first conduction layer; and patterning the first conduction layer by said storage node pattern.

BRIEF DESCRIPTION OF THE DRAWINGS

Other objects and aspects of the invention will become apparent from the following description of embodiments with reference to the accompanying drawings in which:

FIGS. 1a to 1g are sectional views respectively illustrating a method for fabricating a conventional semiconductor memory device equipped with a capacitor storage node having a cylindrical structure;

FIG. 2 is a sectional view illustrating a semiconductor memory device in accordance with the first embodiment of the present invention;

FIG. 3 is a perspective view only showing a capacitor storage electrode portion of the semiconductor memory device in accordance with the first embodiment of the present invention;

FIGS. 6a to 6g are sectional views respectively illustrating a method for fabricating a semiconductor memory device in accordance with a third embodiment of the present invention;

FIGS. 7a to 7g are sectional views respectively illustrating a method for fabricating a semiconductor memory device in accordance with a fourth embodiment of the present invention;

FIGS. 8a to 8g are sectional views respectively illustrating a method for fabricating a semiconductor memory device in accordance with a fifth embodiment of the present invention;

FIGS. 9a to 9g are sectional views respectively illustrating a method for fabricating a semiconductor memory device in accordance with a sixth embodiment of the present invention; and FIG. 10 is a perspective view of a storage electrode of a capacitor of the semiconductor memory device in accordance with the sixth embodiment of the present invention.

DETAILED DESCRIPTION OF THE PREFERRED EMBODIMENTS

Figure 1A:
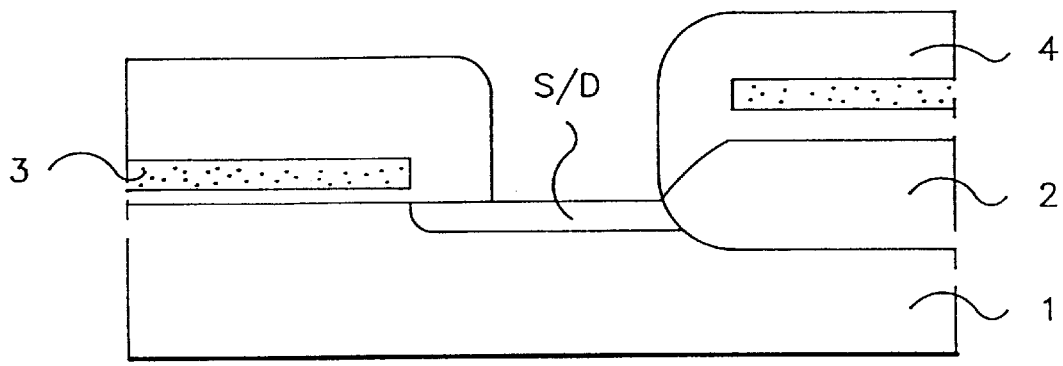
Figure 1B:
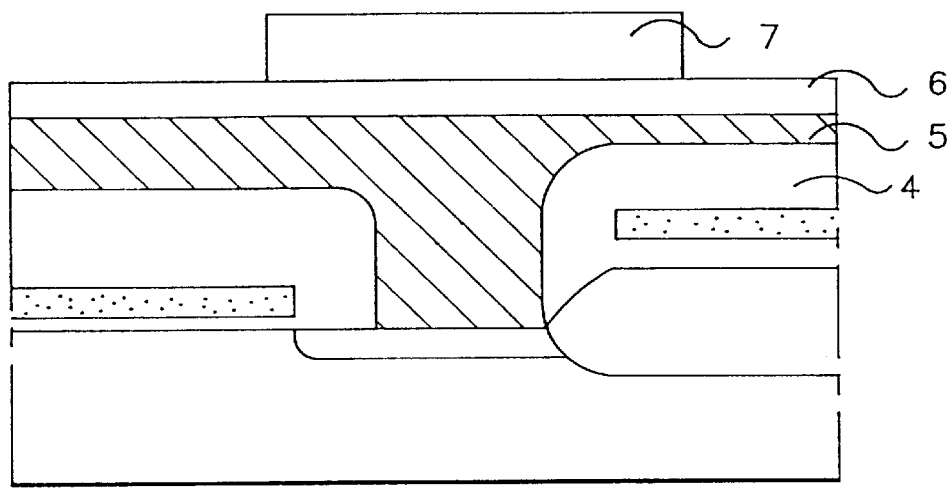
Figure 1C:
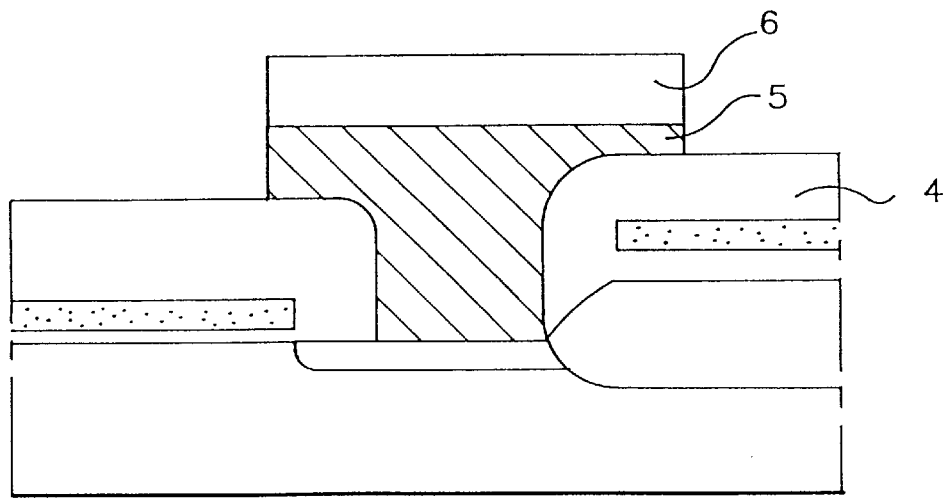

In accordance with the present invention, a semiconductor memory device is provided which is equipped with a capacitor having a capacitor storage node of a composite structure including a lower structure having a cylinder shape and an upper structure formed in the interior of the cylindrical lower structure, thereby capable of maximizing the capacitance of the capacitor.

Now, the present invention will be described, in conjunction with a first embodiment thereof illustrated in FIGS. 2 to 4f.

Generally, a DRAM cell is constituted by a transfer transistor and a charge storage capacitor. The transfer transistor includes a gate electrode, a gate insulating film, a source electrode and a drain electrode. On the other hand, the charge storage capacitor serves to accumulate charges transferred from the transfer transistor and includes a storage electrode connected to the drain electrode or the source electrode of the transfer transistor.

FIG. 2 is a sectional view illustrating a semiconductor memory device in accordance with the first embodiment of the present invention. As shown in FIG. 2, the semiconductor memory device comprises a transfer transistor constituted by a gate electrode 13, a gate insulating film 12 and source and drain electrode S/D, and a capacitor storage electrode 21 formed over the transfer transistor via an insulating film 14 and provided with a capacitor storage electrode 21 connected to the source electrode or the drain electrode of the transfer transistor. The capacitor storage electrode 21 has a cylindrical lower structure connected to the source electrode or the drain electrode of the transfer transistor and a cover type upper structure formed in the interior of the lower structure.

FIG. 3 is a perspective view only showing a capacitor storage electrode portion of the semiconductor memory device in accordance with the first embodiment of the present invention.

As shown in FIG. 3, the capacitor has a cylindrical structure 16 and a cover type structure 19 both constituting the capacitor storage electrode, thereby achieving a maximum increase in effective capacitor area. With such structures, the capacitor can have a maximum capacitance.

FIGS. 4a to 4f are sectional views respectively illustrating a method for fabricating the semiconductor memory device in accordance with the first embodiment of the present invention.

Figure 4A:
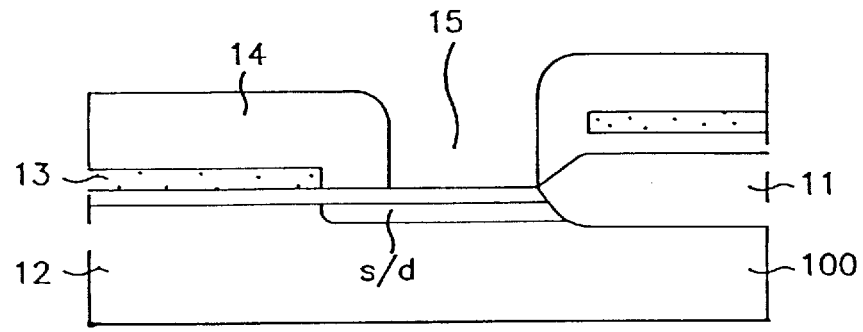
FIGS. 4a to 4f are sectional views respectively illustrating a method for fabricating the semiconductor memory device in accordance with the first embodiment of the present invention.

In accordance with this method, a field oxide film 11 for an element isolation is formed to a thickness of 4,000 Å on a semiconductor substrate 100 by use of a well-known local oxidation of silicon (LOCOS) process, so as to define an element isolation region and an active region, as shown in FIG. 4a. Over the entire exposed surface of the resulting structure, a gate oxide film 12 having a thickness of 100 to 200 Å is formed by use of an oxidation process.

Thereafter, a polysilicon layer doped with an impurity is formed to a thickness of 3,000 to 4,000 Å over the entire exposed surface of the resulting structure by use of a chemical vapor deposition (CVD) process. The polysilicon layer is then patterned using an appropriate gate electrode pattern, thereby forming a gate electrode 13.

Using the gate electrode 13 as a mask, impurity ions such as As$^+$ ions are implanted in an exposed portion of the semiconductor substrate 100 in a concentration of $10^{14}$ to $10^{15} cm^{-3}$ by an accelerated energy of 60 to 80 KeV and then annealed, thereby forming an n type impurity diffused region as source and drain electrodes S/D.

Thus, a transfer transistor is formed which is constituted by the gate electrode 13, the gate insulating film 12 and the source and drain electrodes S/D.

Over the entire exposed surface of the resulting structure including the transfer transistor, a first insulating film 14 comprised of an oxide film or a nitride film is formed by use of the CVD process or a low pressure chemical vapor deposition (LPCVD) process. Subsequently, the first insulating film 14 is selectively etched by use of a photolithography process so as to form a contact hole 15 through which the source electrode or the drain electrode of the transfer transistor is exposed.

Figure 4B:
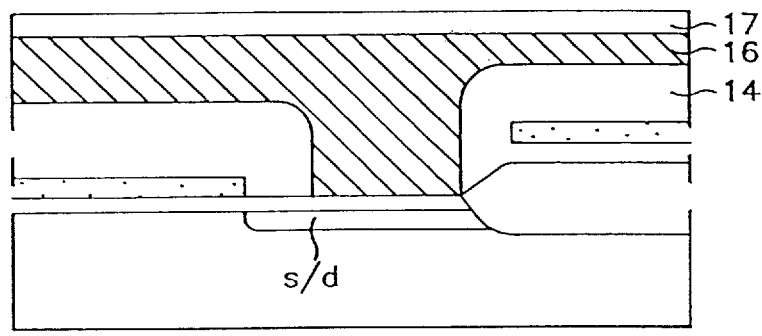

As shown in FIG. 4b, a first conduction layer 16 comprised of a doped amorphous silicon layer or a polysilicon layer is formed to a thickness of 3,000 to 5,000 Å over the entire exposed surface of the resulting structure including the first insulating layer 14 by use of the LPCVD process at a temperature of 520° to 620° C. under a condition that a gas of $SiH_4$ or $Si_2H_6$ and a gas of $PH_3$ are used. At this time, the thickness of the first conduction layer 16 is determined such that the first conduction layer 16 fills the contact hole 15. Preferably, the thickness of the first conduction layer 16 is larger than the radius of the contact hole 15.

Thereafter, a second insulating layer 17 comprised of, for example, an oxide film or a nitride film is formed to a thickness of about 1,000 Å over the first conduction layer 16 by use of the CVD process or a plasma enhanced chemical vapor deposition (PECVD) process.

Figure 4C:
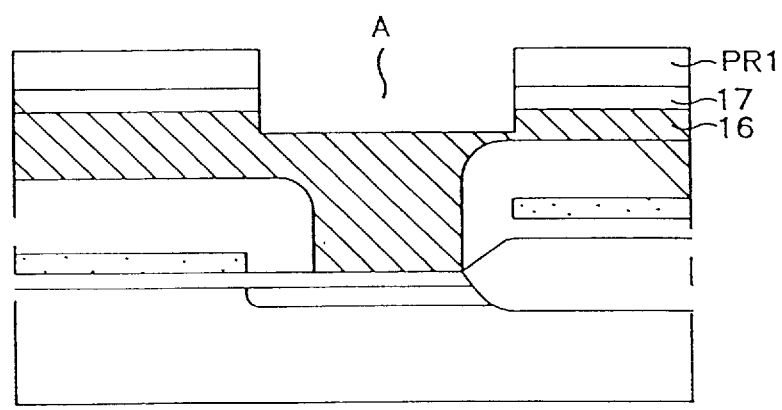

As shown in FIG. 4c, a photoresist film is then coated over the second insulating layer 17. The photoresist film is patterned by use of the photolithography process to form a predetermined photoresist pattern PR1. Using the photoresist pattern PR1 as a mask, the second insulating layer 17 and the first conduction layer 16 are then selectively etched by use of an anisotropic dry etching process such as a reactive ion etching (RIE) process. At this time, the etching of the second insulating layer 17 is carried out by using a gas containing $CF_4$ and $H_2$. On the other hand, the etching of the first conduction layer 16 comprised of the silicon layer is carried out by using a gas such as $CCl_2$ and $O_2$. As shown in FIG. 4c, the first conduction layer 16 is etched to a predetermined depth for forming a step corresponding to the height of each side wall of a cylindrical structure to be formed while remaining a portion of the first conduction layer 16 to form a bottom of the cylindrical structure.

Figure 4D:
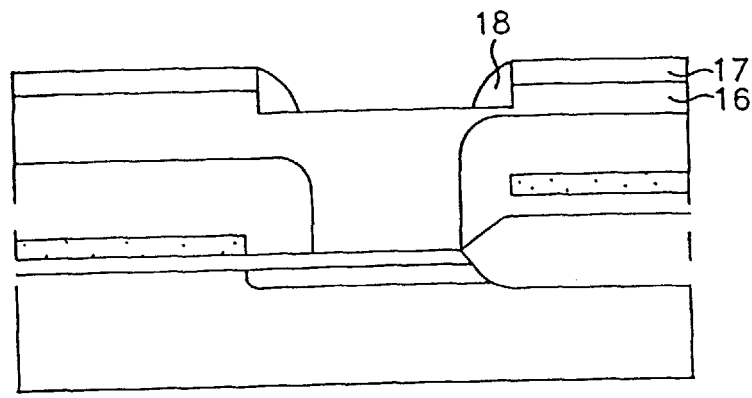

The photoresist pattern PR1 is then removed, as shown in FIG. 4d. Over the entire exposed surface of the resulting structure, a third insulating layer comprised of an oxide film or a nitride film is formed to a thickness of about 1,000 Å by use of the CVD process or the PECVD process. Thereafter, the resulting structure is subjected to an etchback process using no mask, thereby forming side wall spacers 18 on side surfaces of the second insulating layer 17 and the first conduction layer 16.

Over the entire exposed surface of the resulting structure, a second conduction layer 19 comprised of a silicon layer is then formed to a thickness of 1,000 Å by use of the LPCVD process.

Figure 4E:
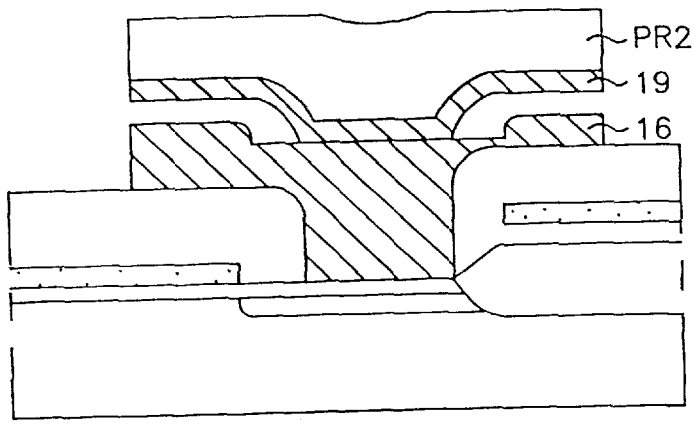

Subsequently, another photoresist film is coated over the second conduction layer 19, as shown in FIG. 4e. The photoresist film is then patterned by use of the photolithography process using a predetermined capacitor storage electrode pattern as a mask, so as to form a photoresist pattern PR2.

Using the photoresist pattern PR2 as a mask, the second conduction layer 19 is selectively etched, so that the second insulating layer 17 can be exposed. Then, the second insulating layer 17 and the side wall spacers 18 are removed by use of a wet etching process. Where the second insulating layer 17 is the oxide film, a solution containing HF is utilized in the etching step. On the other hand, where the second insulating layer 17 is the nitride film, a solution containing a phosphoric acid ($H_3PO_4$) is utilized in the etching step.

A portion of the first conduction layer 16 exposed after the removal of the second insulating layer 17 and the side wall spacers 18 are selectively etched using the photoresist pattern PR2 as a mask.

Figure 4F:
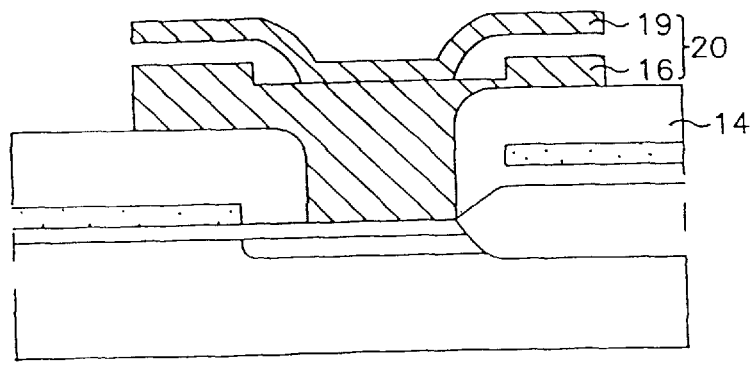

As shown in FIG. 4f, the photoresist pattern PR2 is then removed. As a result, a capacitor storage electrode 20 is obtained which is constituted by a cylindrical lower structure comprised of the first conduction layer 16 and a cover type upper structure provided with a lower portion seated in the interior of the lower structure and comprised of the second conduction layer 19.

Thereafter, a capacitor dielectric film 21 is formed over the entire surface of the capacitor storage electrode 20. Over the capacitor dielectric film 21, a conduction material is deposited to form a -capacitor plate electrode 22. Thus, a capacitor of a semiconductor memory device having the structure of the first embodiment of the present invention shown in FIG. 2 is fabricated.

Figure 5A:
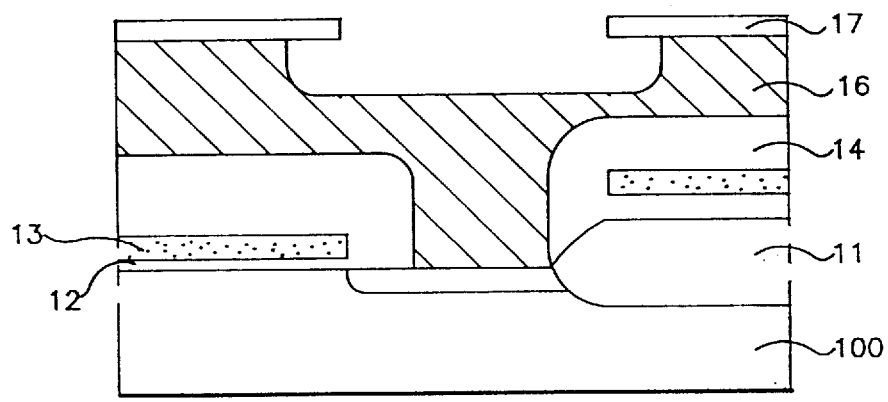
FIGS. 5a and 5b are sectional views respectively illustrating a method for fabricating a semiconductor memory device in accordance with a second embodiment of the present invention.
Figure 5B:
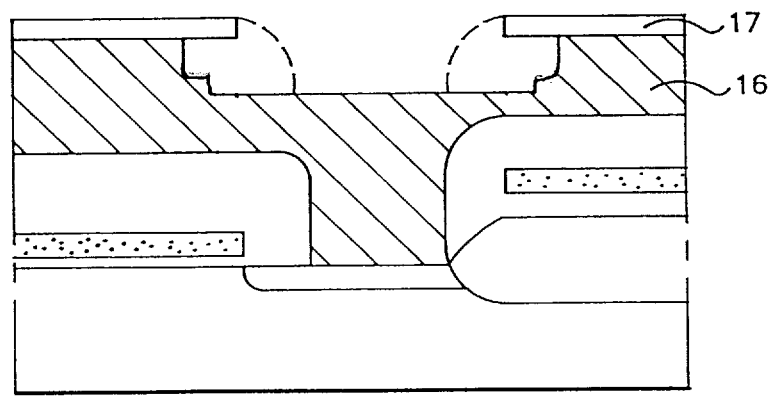

FIGS. 5a and 5b are sectional views respectively illustrating a method for fabricating a semiconductor memory device in accordance with a second embodiment of the present invention. In FIGS. 5a and 5b, elements corresponding to those in FIGS. 4a to 4f are denoted by the same reference numerals.

In accordance with this method, a photoresist film PR1 is coated over a second insulating layer 17 formed after performing the same steps as those of the first embodiment shown in FIGS. 4a to 4c. The formation of the photoresist film PR1 is achieved in the same manner as that of the first embodiment. The photoresist film PR1 is then patterned by use of the photolithography process to form a predetermined photoresist pattern (not shown). Using the photoresist pattern as a mask, the second insulating layer 17 is selectively etched by use of an anisotropic dry etching process such as the RIE process, so as to partially expose a first conduction layer 16 disposed beneath the second insulating layer 17, as shown in FIG. 5a. At this time, the etching of the second insulating layer 17 is carried out by using a gas containing $CF_4$ and $H_2$. Thereafter, the first conduction layer 16 is isotropically etched by use of an isotropic etching process and then anisotropically etched by use of an anisotropic etching process, so that it can have an undercut at each side wall of the interior of its cylindrical structure, as shown in FIG. 5b. Subsequently, the same steps as those shown in FIGS. 4d to 4f are carried out to obtain a capacitor of a semiconductor memory device in accordance with the second embodiment.

In accordance with the second embodiment, the first conduction layer 16 may be subjected to only the isotropic etching process. Even in this case, the same subsequent steps as those in the above-mentioned case may be carried out.

FIGS. 6a to 6g are sectional views respectively illustrating a method for fabricating a semiconductor memory device in accordance with a third embodiment of the present invention. In FIGS. 6a to 6g, elements corresponding to those in FIGS. 4a to 4f are denoted by the same reference numerals.

In accordance with this method, a field oxide film 11 for an element isolation is formed to a thickness of 4,000 Å on a semiconductor substrate 100 by use of the well-known LOCOS process, so as to define an element isolation region and an active region, as shown in FIG. 6a. Over the entire exposed surface of the resulting structure, a gate oxide film 12 having a thickness of 100 to 200 Å is formed by use of an oxidation process.

Thereafter, a polysilicon layer doped with an impurity is formed to a thickness of 3,000 to 4,000 Å over the entire exposed surface of the resulting structure by use of the CVD process. The polysilicon layer is then patterned using an appropriate gate electrode pattern, thereby forming a gate electrode 13.

Using the gate electrode 13 as a mask, impurity ions such as $As^+$ ions are implanted in an exposed portion of the semiconductor substrate 100 in a concentration of $10^{14}$ to $10^{15} cm^{-3}$ by an accelerated energy of 60 to 80 KeV and then annealed, thereby forming an n type impurity diffused region as source and drain electrodes S/D.

As a result, a transfer transistor is formed which is constituted by the gate electrode 13, the gate insulating film 12 and the source and drain electrodes S/D.

Over the entire exposed surface of the resulting structure including the transfer transistor, a first insulating film 14 comprised of an oxide film or a nitride film is formed by use of the CVD process or the LPCVD process. Subsequently, the first insulating film 14 is selectively etched by use of the photolithography process so as to form a contact hole 15 through which the source electrode or the drain electrode of the transfer transistor is exposed.

A first conduction layer 16 comprised of a doped amorphous silicon layer or a polysilicon layer is then formed to a thickness of 3,000 to 5,000 Å over the entire exposed surface of the resulting structure including the first insulating layer 14 by use of the LPCVD process, as shown in FIG. 6b. The formation of the first conduction layer 16 is carried out at a temperature of 520° to 620° C. under a condition that a gas of $SiH_4$ or $Si_2H_6$ and a gas of $PH_3$ are used. At this time, the thickness of the first conduction layer 16 is determined such that the first conduction layer 16 fills the contact hole 15. Preferably, the thickness of the first conduction layer 16 is larger than the radius of the contact hole 15.

Then, a photoresist film is coated over the first conduction layer 16, as shown in FIG. 6c. The photoresist film is patterned by use of the photolithography process to form a predetermined photoresist pattern PR1. Using the photoresist pattern PR1 as a mask, the first conduction layer 16 is then selectively etched by use of the anisotropic dry etching process such as the RIE process. At this time, the etching of the first conduction layer 16 comprised of a silicon layer is carried out by using a gas such as $CCl_2$ and $O_2$. As shown in FIG. 4c, the first conduction layer 16 is etched to a predetermined depth for forming a step corresponding to the height of each side wall of a cylindrical structure to be formed while remaining a portion of the first conduction layer 16 to form a bottom of the cylindrical structure.

Figure 6D:
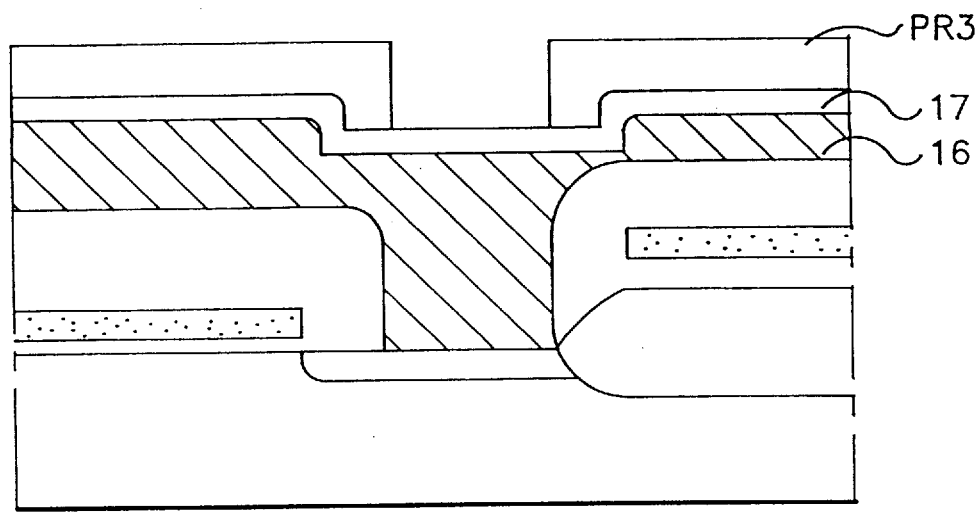

Subsequently, the photoresist pattern PR1 is removed, as shown in FIG. 6d. Over the entire exposed surface of the resulting structure, a second insulating layer 17 comprised of, for example, an oxide film or a nitride film is formed to a thickness of about 1,000 Å by use of the CVD process or the PECVD process. Another photoresist film is then coated over the second insulating layer 17. The photoresist film is patterned by use of the photolithography process to form a predetermined photoresist pattern PR3.

Figure 6E:
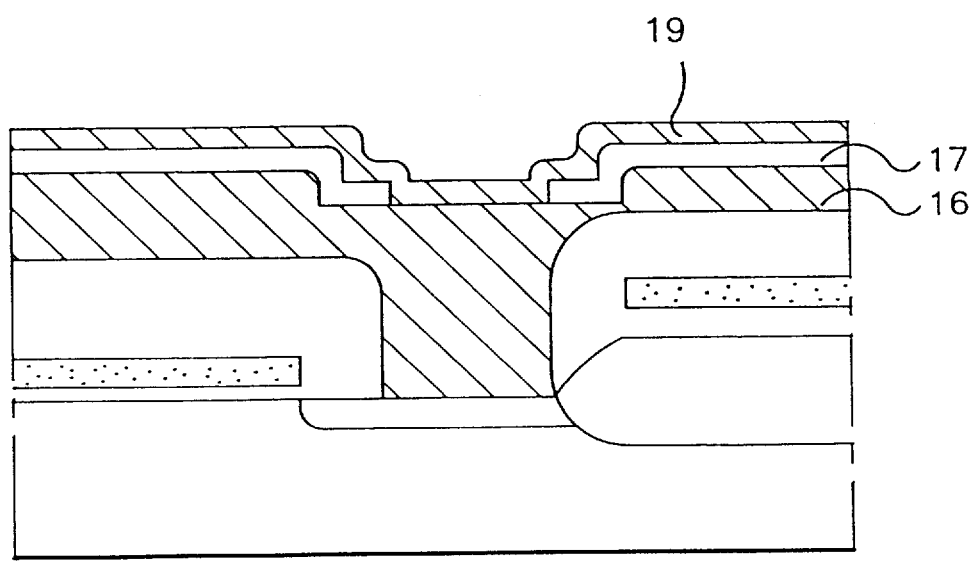

Using the photoresist pattern PR3 as a mask, the second insulating layer 17 is selectively etched so that the first conduction layer 16 can be partially exposed, as shown in FIG. 6e. Over the entire exposed surface of the resulting structure, a second conduction layer 19 comprised of a doped silicon layer is then formed to a thickness of about 1,000 Å by use of, for example, the LPCVD process.

Figure 6F:
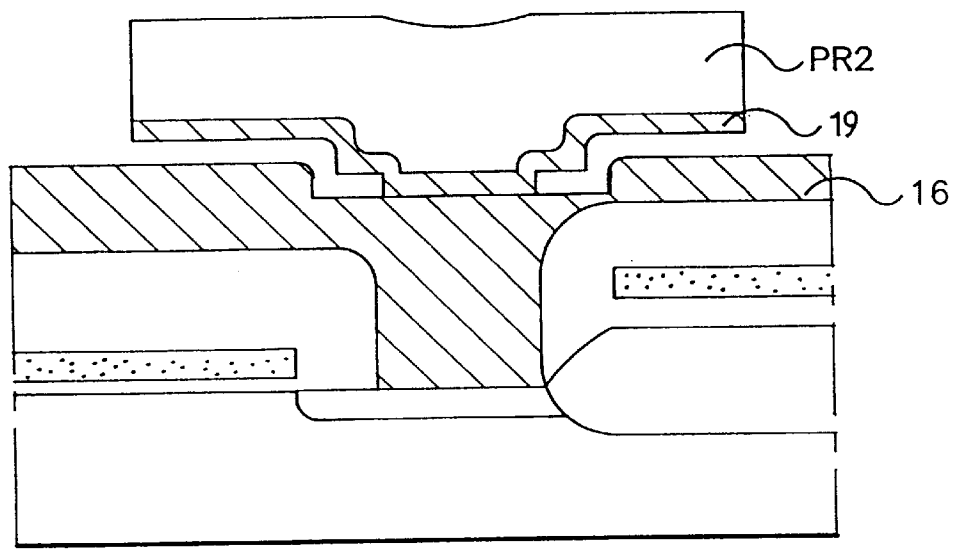

Subsequently, another photoresist film is coated over the second conduction layer 19, as shown in FIG. 6f. The photoresist film is then patterned by use of the photolithography process using a predetermined capacitor storage electrode pattern as a mask, thereby forming a photoresist pattern PR2.

Using the photoresist pattern PR2 as a mask, the second conduction layer 19 is selectively etched, so that the second insulating layer 17 can be exposed. Then, the second insulating layer 17 is removed by use of a wet etching process. Where the second insulating layer 17 is the oxide film, a solution containing HF is utilized in the etching step. On the other hand, where the second insulating layer 17 is the nitride film, a solution containing a phosphoric acid ($H_3PO_4$) is utilized in the etching step.

Figure 6G:
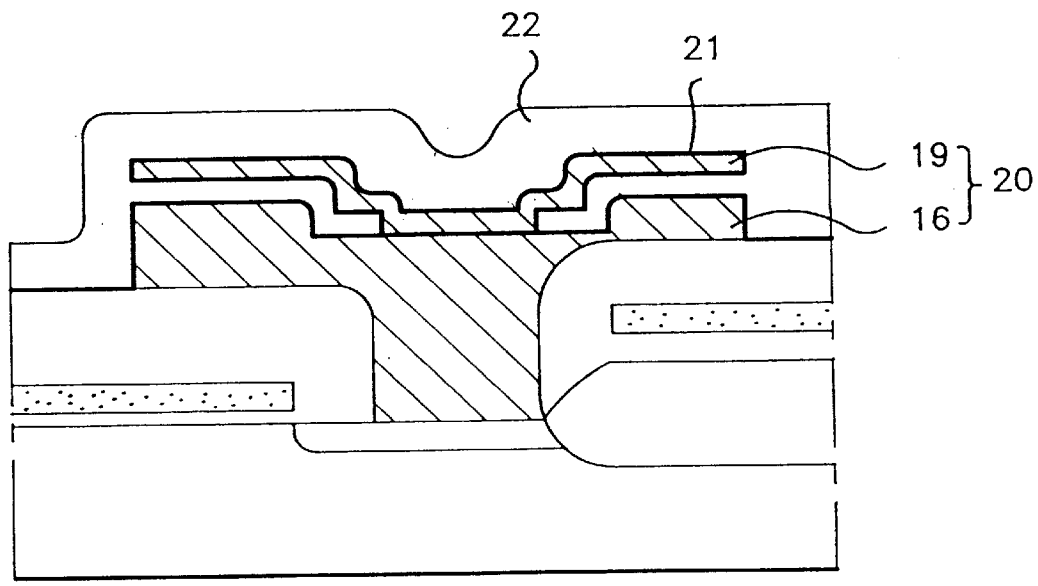

Then, a portion of the first conduction layer 16 exposed after the removal of the second insulating layer 17 is selectively etched using the photoresist pattern PR2 as a mask, as shown in FIG. 6g. The photoresist pattern PR2 is then removed. As a result, a capacitor storage electrode 20 is obtained which is constituted by a cylindrical lower structure comprised of the first conduction layer 16 and a cover type upper structure provided with a lower portion seated in the interior of the lower structure and comprised of the second conduction layer 19. Thereafter, a capacitor dielectric film 21 is formed over the entire surface of the capacitor storage electrode 20. Over the capacitor dielectric film 21, a conduction material is deposited to form a capacitor plate electrode 22. Thus, a capacitor of a semiconductor memory device in accordance with the third embodiment of the present invention is fabricated.

FIGS. 7a to 7g are sectional views respectively illustrating a method for fabricating a semiconductor memory device in accordance with a fourth embodiment of the present invention. In FIGS. 7a to 7g, elements corresponding to those in FIGS. 4a to 4f are denoted by the same reference numerals.

In accordance with this method, a transfer transistor constituted by a gate electrode 13, a gate insulating film 12 and source and drain electrodes S/D is formed on a semiconductor substrate 100 in the same manner as those in the first to third embodiments. Over the entire exposed surface of the resulting structure including the transfer transistor, a first insulating film 14 comprised of an oxide film or a nitride film is formed by use of the CVD process or the LPCVD process. Subsequently, the first insulating film 14 is selectively etched by use of the photolithography process so as to form a contact hole 15 through which the source electrode or the drain electrode of the transfer transistor is exposed.

Figure 7A:
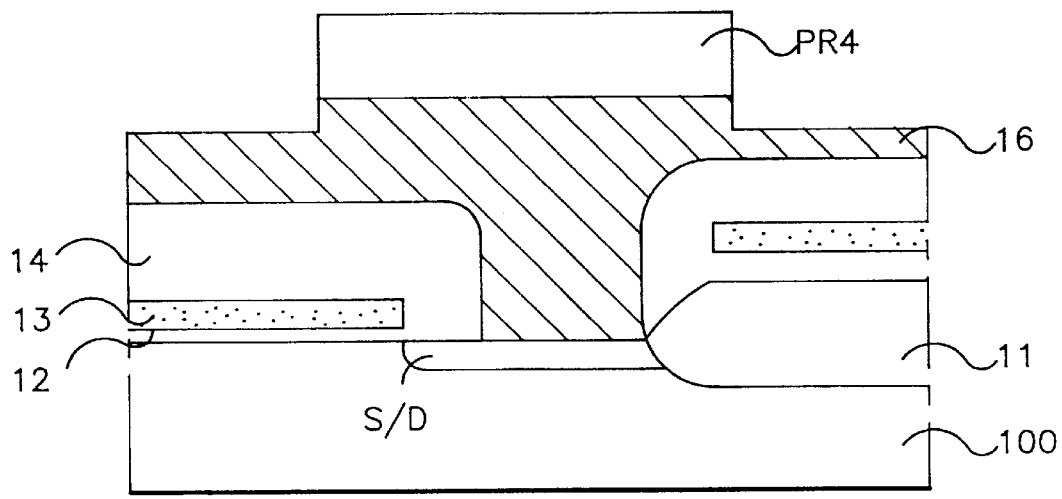

As shown in FIG. 7a, a first conduction layer 16 comprised of a doped amorphous silicon layer or a polysilicon layer is then formed to a thickness of 3,000 to 5,000 Å over the entire exposed surface of the resulting structure including the first insulating layer 14 by use of the LPCVD process. The formation of the first conduction layer 16 is carried out at a temperature of 520° to 620° C. under a condition that a gas of $SiH_4$ or $Si_2H_6$ and a gas of $PH_3$ are used. At this time, the thickness of the first conduction layer 16 is determined such that the first conduction layer 16 fills the contact hole 15. Preferably, the thickness of the first conduction layer 16 is larger than the radius of the contact hole 15.

A photoresist film is then coated over the first conduction layer 16. The photoresist film is patterned by use of the photolithography process to form a predetermined photoresist pattern PR4. Using the photoresist pattern PR4 as a mask, the first conduction layer 16 is then selectively etched by use of the anisotropic dry etching process such as the RIE process. At this time, the first conduction layer 16 is etched to a predetermined depth without being completely etched, so that it can have steps.

Figure 7B:
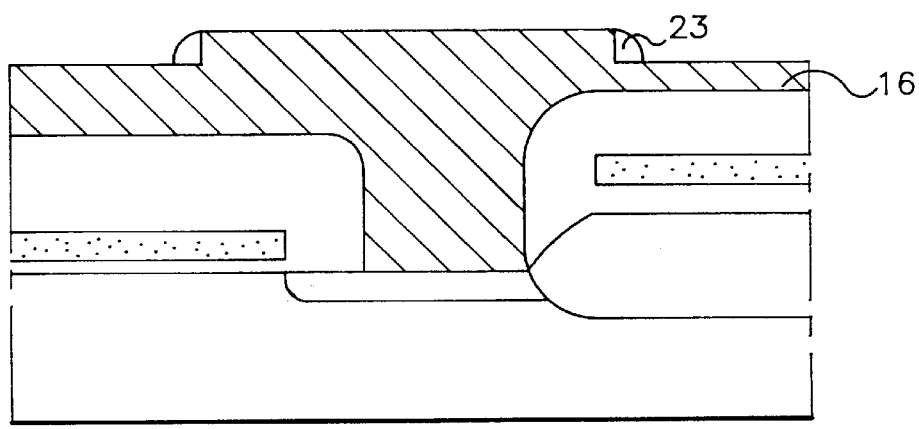

Subsequently, the photoresist pattern PR4 is removed, as shown in FIG. 7b. Over the entire exposed surface of the resulting structure, an insulating layer comprised of, for example, an oxide film or a nitride film is formed to a thickness of about 1,000 Å by use of the CVD process or the PECVD process. Thereafter, the insulating layer is subjected to an etchback process using no mask, thereby forming first side wall spacers 23 on the steps of the first conduction layer 16.

Figure 7C:
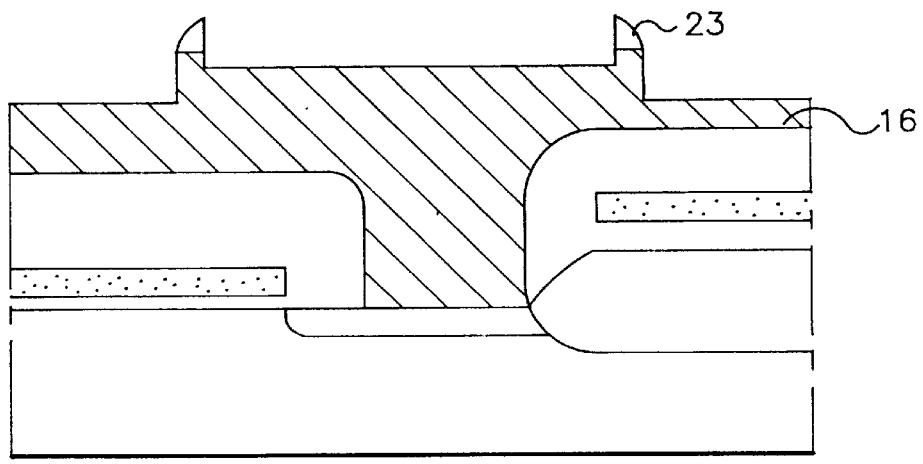

Using the first side wall spacers 23 as a mask, the first conduction layer 16 is etched to a predetermined depth corresponding to the height of each side wall of a cylindrical structure to be formed, as shown in FIG. 7c.

Figure 7D:
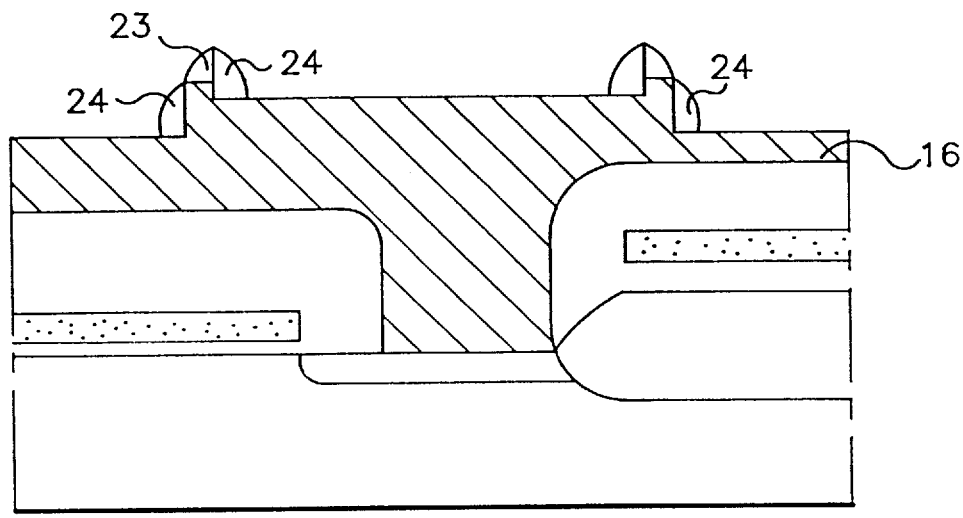

Over the entire exposed surface of the resulting structure, another insulating layer comprised of, for example, an oxide film or a nitride film is formed to a thickness of about 1,000 Å by use of the CVD process or the PECVD process, as shown in FIG. 7d. Thereafter, the insulating layer is subjected to an etchback process using no mask, thereby forming second side wall spacers 24 on the steps of the first conduction layer 16.

Figure 7E:
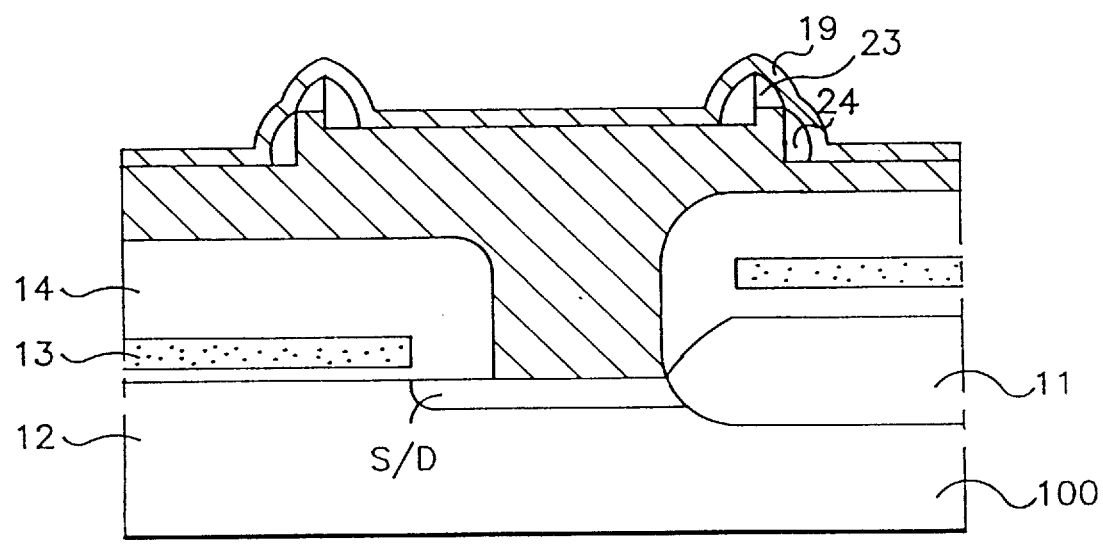

A second conduction layer 19 comprised of a doped silicon layer is then formed to a thickness of about 1,000 Å over the entire exposed surface of the resulting structure, by use of, for example, the LPCVD process, as shown in FIG. 7e.

Subsequently, another photoresist film is coated over the second conduction layer 19, as shown in FIG. 7f. The photoresist film is then patterned by use of the photolithography process using a predetermined capacitor storage electrode pattern as a mask, thereby forming a photoresist pattern PR2.

Using the photoresist pattern PR2 as a mask, the second conduction layer 19 is selectively etched. Then, the first side wall spacers 23 and the second side wall spacers 24 are removed by use of the wet etching process. Where the side wall spacers 23 and 24 are comprised of oxide films, a solution containing HF is utilized in the etching step. On the other hand, where the side wall spacers 23 and 24 are comprised of nitride films, a solution containing a phosphoric acid ($H_3PO_4$) is utilized in the etching step.

Then, a portion of the first conduction layer 16 exposed after the removal of the side wall spacers 23 and 24 is selectively etched using the photoresist pattern PR2 as a mask.

As shown in FIG. 7g, the photoresist pattern PR2 is then removed. As a result, a capacitor storage electrode 20 is obtained which is constituted by a cylindrical lower structure comprised of the first conduction layer 16 and a cover type upper structure provided with a lower portion seated in the interior of the lower structure and comprised of the second conduction layer 19. Thereafter, a capacitor dielectric film 21 is formed over the entire surface of the capacitor storage electrode 20. Over the capacitor dielectric film 21, a conduction material is deposited to form a capacitor plate electrode 22. Thus, a capacitor of a semiconductor memory device in accordance with the fourth embodiment of the present invention is fabricated.

FIGS. 8a to 8g are sectional views respectively illustrating a method for fabricating a semiconductor memory device in accordance with a fifth embodiment of the present invention. In FIGS. 8a to 8g, elements corresponding to those in FIGS. 4a to 4f are denoted by the same reference numerals.

In accordance with this method, a transfer transistor constituted by a gate electrode 13, a gate insulating film 12 and source and drain electrodes S/D is formed on a semiconductor substrate 100 in the same manner as those in the first to third embodiments. Over the entire exposed surface of the resulting structure including the transfer transistor, a first insulating film 14 comprised of an oxide film or a nitride film is formed by use of the CVD process or the LPCVD process. Subsequently, the first insulating film 14 is selectively etched by use of the photolithography process so as to form a contact hole 15 through which the source electrode or the drain electrode of the transfer transistor is exposed.

Figure 8A:
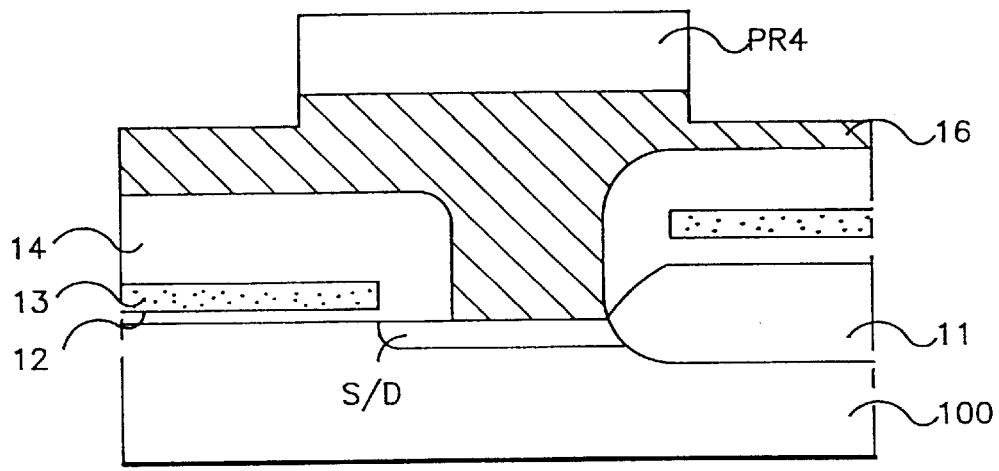

Over the entire exposed surface of the resulting structure including the first insulating layer 14, a first conduction layer 16 comprised of a doped amorphous silicon layer or a polysilicon layer is then formed to a thickness of 3,000 to 5,000 Å by use of the LPCVD process, as shown in FIG. 8a. The formation of the first conduction layer 16 is carried out at a temperature of 520° to 620° C. under a condition that a gas of $SiH_4$ or $Si_2H_6$ and a gas of $PH_3$ are used. At this time, the thickness of the first conduction layer 16 is determined such that the first conduction layer 16 fills the contact hole 15. Preferably, the thickness of the first conduction layer 16 is larger than the radius of the contact hole 15.

A photoresist film is then coated over the first conduction layer 16. The photoresist film is patterned by use of the photolithography process to form a predetermined photoresist pattern PR4. Using the photoresist pattern PR4 as a mask, the first conduction layer 16 is then selectively etched to a predetermined depth without being completely etched, so that it can have steps.

Figure 8B:
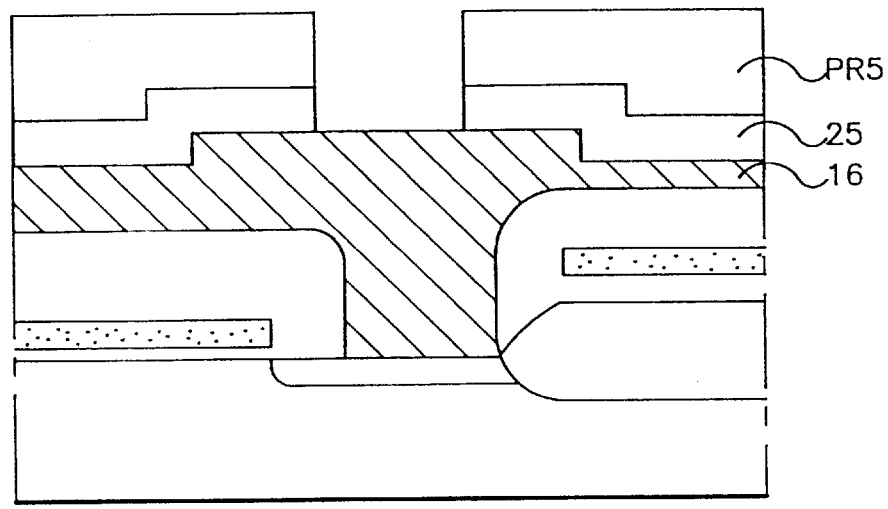

Subsequently, the photoresist pattern PR4 is removed, as shown in FIG. 8b. Over the entire exposed surface of the resulting structure, a nitride film 25 as an insulating layer is formed to a thickness of about 1,000 Å by use of the CVD process or the PECVD process. Over the nitride film 25, another photoresist film is coated to form a predetermined photoresist pattern PR5. Using the photoresist pattern PR5 as a mask, the nitride film 25 is selectively etched, thereby exposing a predetermined portion of the first conduction layer 16.

Figure 8C:
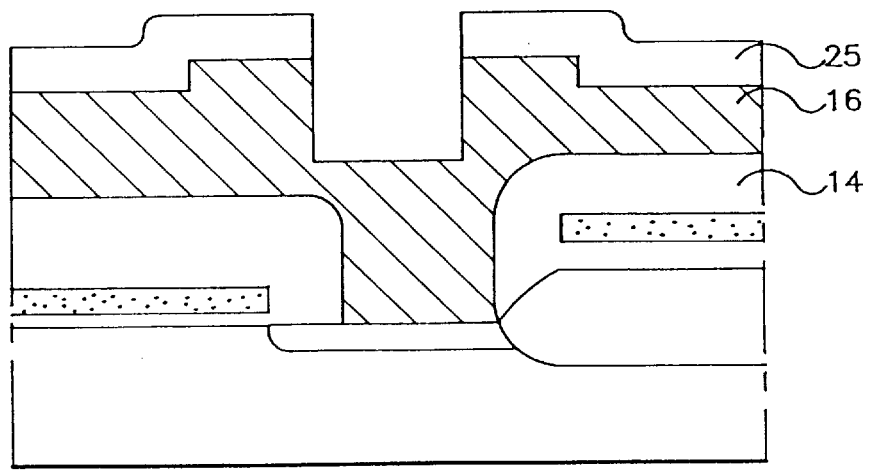

Using the remaining portion of the nitride film 25 as a mask, the exposed portion of the first conduction layer 16 is selectively etched to a predetermined depth by use of the anisotropic etching process, as shown in FIG. 8c.

A second conduction layer 19 comprised of a doped silicon layer is then formed to a thickness of about 1,000 Å over the entire exposed surface of the resulting structure, by use of, for example, the LPCVD process, as shown in FIG. 8d.

Subsequently, another photoresist film is formed over the second conduction layer 19, as shown in FIG. 8e. The photoresist film is then patterned by use of the photolithography process using a predetermined capacitor storage electrode pattern as a mask, thereby forming a photoresist film PR6. Using the photoresist pattern PR6 as a mask, the second conduction layer 19 and the nitride film 25 are anisotropically dry-etched so that side wall spacers can be formed on steps of the first conduction layer 16.

Thereafter, the first conduction layer 16 is etched to a predetermined depth under a condition that the photoresist pattern PR6 and the side wall spacers 25A are used as a mask, as shown in FIG. 8f.

Figure 8G:
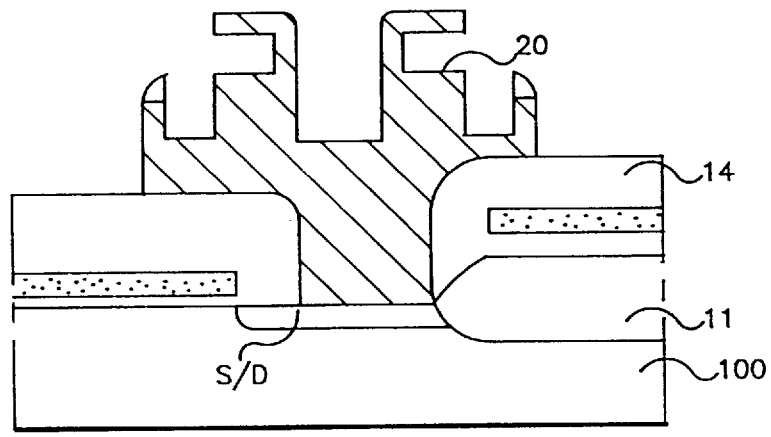

As shown in FIG. 8g, the side wall spacers 25A and the nitride film 25 remaining between the second conduction layer 19 and the first conduction layer 16 are removed by use of the wet etching process. As a result, a capacitor storage electrode 20 is obtained which has a double-cylindrical structure.

Over the entire surface of the capacitor storage electrode 20, a capacitor dielectric film is formed in the same manner as those in the above-mentioned embodiments. Over the capacitor dielectric film, a conduction material is deposited to form a capacitor plate electrode. Thus, a capacitor of a semiconductor memory device in accordance with the fifth embodiment of the present invention is fabricated.

FIGS. 9a to 9g are sectional views respectively illustrating a method for fabricating a semiconductor memory device in accordance with a sixth embodiment of the present invention. In FIGS. 9a to 9g, elements corresponding to those in FIGS. 4a to 4f are denoted by the same reference numerals.

In accordance with this method, a transfer transistor constituted by a gate electrode 13, a gate insulating film 12 and source and drain electrodes S/D is formed on a semiconductor substrate 100 in the same manner as those in the above-mentioned embodiments. Over the entire exposed surface of the resulting structure including the transfer transistor, a first insulating film 14 comprised of an oxide film or a nitride film is formed by use of the CVD process or the LPCVD process. Subsequently, the first insulating film 14 is selectively etched by use of the photolithography process so as to form a contact hole 15 through which the source electrode or the drain electrode of the transfer transistor is exposed.

Figure 9A:
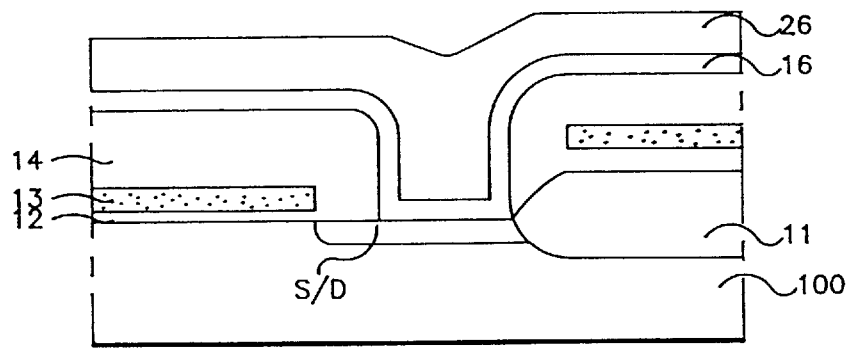

As shown in FIG. 9a, a first conduction layer 16 comprised of a doped amorphous silicon layer or a polysilicon layer is then formed to a thickness of about 1,000 Å over the entire exposed surface of the resulting structure including the first insulating layer 14 by use of the LPCVD process. The formation of the first conduction layer 16 is carried out at a temperature of 520° to 620° C. under a condition that a gas of $SiH_4$ or $Si_2H_6$ and a gas of $PH_3$ are used. Over the entire exposed surface of the resulting structure, another insulating layer 26 comprised of an oxide film or a nitride film is then formed to a thickness of 1,000 Å by use of the CVD process or the LPCVD process.

Figure 9B:
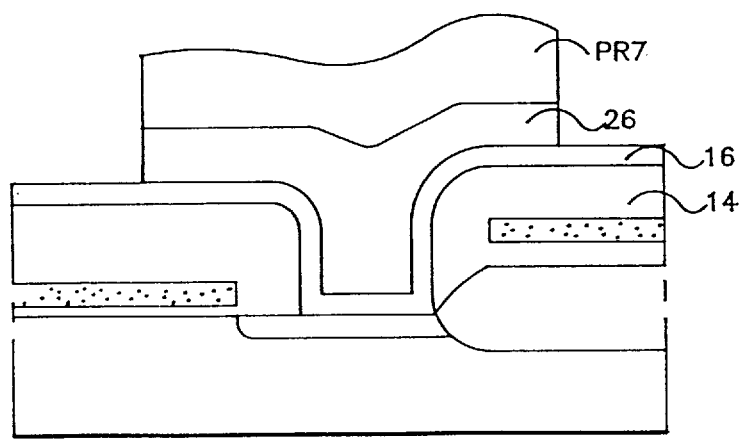

A photoresist film is then coated over the insulating layer 26, as shown in FIG. 9b. The photoresist film is patterned by use of the photolithography process to form a predetermined photoresist pattern PR7. Using the photoresist pattern PR7 as a mask, the insulating layer 26 is then selectively etched.

Subsequently, the first conduction layer 16 is selectively etched by use of the anisotropic etching process under a condition that the photoresist pattern PR7 is used as a mask. The photoresist pattern PR7 is then removed, as shown in FIG. 9c.

Over the entire exposed surface of the resulting structure, a second conduction layer 19 comprised of a doped silicon layer is then formed to a thickness of about 1,000 Å by use of, for example, the LPCVD process, as shown in FIG. 9d.

Subsequently, another photoresist film is coated over the second conduction layer 19, as shown in FIG. 9e. The photoresist film is then patterned by use of the photolithography process, thereby forming a photoresist pattern PR8 having a size smaller than that of the remaining portion of the insulating film 26. Using the photoresist pattern PR8 as a mask, the second conduction layer 19 is etched such that the insulating film 26 is partially exposed while side wall spacers 19A are formed on side surfaces of the insulating film 26. The side wall spacers 19A are formed from the second conduction layer 19.

As shown in FIG. 9f, the photoresist pattern PR8 is then removed. Then, the insulating film 16 is removed by use of the wet etching process, as shown in FIG. 9g. As a result, a capacitor storage electrode 20 is obtained which is constituted by a cylindrical lower structure comprised of the first conduction layer 16 and a cover type upper structure connected with the lower structure and comprised of the second conduction layer 19 and the side wall spacers 19A.

FIG. 10 is a perspective view of the structure of the storage electrode 20 shown in FIG. 9g. As shown in FIG. 10, the upper, second conduction layer 19 is partially connected with the lower, first conduction layer 16 connected with the second conduction layer side wall spacers 19A by means of side walls.

Over the entire surface of the capacitor storage electrode 20, a capacitor dielectric film is formed in the same manner as those in the above-mentioned embodiments. Over the capacitor dielectric film, a conduction material is deposited to form a capacitor plate electrode. Thus, a capacitor of a semiconductor memory device in accordance with the sixth embodiment of the present invention is fabricated.

As apparent from the above description, the present invention provides a semiconductor memory device which is equipped with a capacitor having a capacitor storage node of a composite structure including a lower structure having a cylinder shape and a cover type upper structure connected with the lower structure. With this structure, the present invention utilizes efficiently a three-dimensional space structure and thereby achieves an increase in capacitance.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising a plurality of memory cells, each of the memory cells including:
   a transfer transistor having a gate electrode, a gate insulating film, a source region, and a drain region:
   an insulating layer formed over the transfer transistor, the insulating layer having a contact hole exposing one of the source region and the drain region; and
   a charge storage capacitor having a storage node, a dielectric film and a plate electrode, wherein the storage node of the charge storage capacitor comprises:
      a cylindrical lower electrode formed above the transfer transistor and connected to the one of the source region and the drain region of the transfer transistor via the contact hole, and
      a cover type upper electrode formed above the lower electrode and the contact hole, the cover type upper electrode being aligned with the lower electrode and connected with the lower electrode over the contact hole, wherein the upper electrode of the storage node has a planar outer portion and a curved central portion connected to the lower electrode.

2. The semiconductor memory device according to claim 1, wherein said upper and lower electrodes of said storage node define partially a space therebetween.

3. The semiconductor memory device according to claim 1, wherein the upper electrode of the storage node has a structure having a central portion connected to the lower electrode and an outer portion isolated from the lower electrode.

4. The semiconductor memory device according to claim 1, wherein the upper electrode of the storage node has a planar dimension not larger than that of the lower electrode.

5. The semiconductor memory device according to claim 1, wherein the cover type upper electrode is connected to the lower electrode directly above a central portion of the contact hole.

6. The semiconductor memory device according to claim 1, wherein the lower electrode fully fills the contact hole.

7. A semiconductor memory device comprising a plurality of memory cells, each of the memory cells including:

a transfer transistor having a gate electrode, a gate insulating film, a source region, and a drain region;

an insulating layer formed over the transfer transistor, the insulating layer having a contact hole exposing one of the source region and the drain region; and a charge storage capacitor having a storage node, a dielectric film and a plate electrode, wherein the storage node of the charge storage capacitor comprises:

a cylindrical lower electrode formed above the transfer transistor and connected to the one of the source region and the drain region of the transfer transistor via the contact hole, and a cover type upper electrode formed above the lower electrode and the contact hole, the cover type upper electrode being aligned with the lower electrode and connected with the lower electrode over the contact hole, wherein the upper electrode of the storage node includes a central portion, an outer portion, and at least one step disposed between the central portion and the outer portion.

8. The semiconductor memory device according to claim 7, wherein said upper and lower electrodes of said storage node define partially a space therebetween.

9. The semiconductor memory device according to claim 7, wherein the upper electrode of the storage node has a structure having the central portion connected to the lower electrode and an outer portion isolated from the lower electrode.

10. The semiconductor memory device according to claim 7, wherein the upper electrode of the storage node has a planar dimension not larger than that of the lower electrode.

11. The semiconductor memory device according to claim 7, wherein the outer portion is planar and the central portion is curved, the central portion being connected to the lower electrode.

12. The semiconductor memory device according to claim 7, wherein the cover type upper electrode is connected to the lower electrode directly above the central portion of the contact hole.

13. The semiconductor memory device according to claim 7, wherein the lower electrode fully fills the contact hole.

* * * * *